United States Patent
Yun et al.

(10) Patent No.: US 7,638,433 B2
(45) Date of Patent: Dec. 29, 2009

(54) SEMICONDUCTOR DEVICE AND METHOD OF FABRICATING THE SAME

(75) Inventors: Jong-Ho Yun, Suwon-si (KR); Gil-Heyun Choi, Seoul (KR); Byung-Hee Kim, Seoul (KR); Hyun-Su Kim, Suwon-si (KR); Eun-Ok Lee, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 66 days.

(21) Appl. No.: 11/965,420

(22) Filed: Dec. 27, 2007

(65) Prior Publication Data
US 2008/0211038 A1    Sep. 4, 2008

(30) Foreign Application Priority Data
Dec. 28, 2006   (KR) ............... 10-2006-0136719

(51) Int. Cl.
  *H01L 21/302*  (2006.01)
  *H01L 21/461*  (2006.01)
  *H01L 29/40*  (2006.01)

(52) U.S. Cl. ............ 438/682; 438/661; 257/757; 257/E21.593; 257/E21.624; 257/E27.01; 257/E27.046

(58) Field of Classification Search ......... 438/738, 438/694, 595, 592, 510, 682, 661, 660; 257/E21.025, 257/E21.034, E21.035, E21.177, 757, 768, 257/E27.053, E27.01, E27.046, E21.593, 257/E21.434, E21.621, E21.622, E21.623, 257/E21.624, E.026
See application file for complete search history.

(56) References Cited

U.S. PATENT DOCUMENTS

| 6,180,469 | B1 | 1/2001 | Pramanick | |
|---|---|---|---|---|
| 6,905,922 | B2 | 6/2005 | Lin et al. | |
| 7,122,472 | B2 | 10/2006 | Fang et al. | |
| 7,229,873 | B2* | 6/2007 | Colombo et al. | 438/231 |
| 2003/0122179 | A1* | 7/2003 | Matsuki et al. | 257/314 |

(Continued)

FOREIGN PATENT DOCUMENTS

JP    2005294799    10/2005

(Continued)

OTHER PUBLICATIONS

English Abstract Publication No. 2005294799, Oct. 20, 2005.

(Continued)

*Primary Examiner*—Caridad M Everhart
(74) *Attorney, Agent, or Firm*—F. Chau & Associates, LLC

(57) ABSTRACT

A method of fabricating a semiconductor device includes forming a preliminary gate pattern on a semiconductor substrate. The preliminary gate pattern includes a gate oxide pattern, a conductive pattern, and a sacrificial insulating pattern. The method further includes forming spacers on opposite sidewalls of the preliminary gate pattern, forming an interlayer dielectric pattern to expose the sacrificial insulating pattern, removing the sacrificial insulating pattern to form an opening to expose the conductive pattern, transforming the conductive pattern into a metal silicide layer and forming a metal barrier pattern along an inner profile of the opening and a metal conductive pattern to fill the opening including the metal barrier pattern. The metal silicide layer and the metal conductive pattern constitute a gate electrode.

20 Claims, 5 Drawing Sheets

U.S. PATENT DOCUMENTS

2003/0162342 A1* 8/2003 Chen et al. .................. 438/199
2005/0199963 A1 9/2005 Aoyama
2007/0026593 A1* 2/2007 Jawarani et al. ............. 438/197
2008/0093675 A1* 4/2008 Yao et al. .................... 257/384

FOREIGN PATENT DOCUMENTS

KR 1020040001861 1/2004

OTHER PUBLICATIONS

English Abstract Publication No. 1020040001861, Jan. 7, 2004.

* cited by examiner

US 7,638,433 B2

SEMICONDUCTOR DEVICE AND METHOD OF FABRICATING THE SAME

CROSS-REFERENCE TO RELATED APPLICATIONS

This U.S. non-provisional patent application claims priority under 35 U.S.C §119 to Korean Patent Application No. 10-2006-136719 filed on Dec. 28, 2006, the entire disclosure of which is hereby incorporated by reference herein in its entirety.

BACKGROUND

The present disclosure relates to semiconductor devices and methods of fabricating semiconductor devices. More particularly, the present disclosure relates to a semiconductor device including a fully silicided (FUSI) gate electrode and a method of fabricating the same.

Generally, a gate electrode of a semiconductor device is formed of polysilicon because a work function can be controlled by implanting dopants into the polysilicon. Thus, a threshold voltage of a transistor may be controlled to be low. For example, in the case of a contemporary metal-oxide semiconductor (CMOS) device where an N-channel MOS (NMOS) transistor and a P-channel MOS (PMOS) transistor are formed parallel to each other, characteristics between the NMOS and PMOS transistors may be readily controlled by forming a gate electrode formed of polysilicon.

However, as semiconductor devices continue to be scaled down, semiconductor devices having a thickness of 50 nanometers or less may encounter difficulties such as depletion and boron penetration which occur at a conventional gate electrode formed of polysilicon. Consequently, a metal gate electrode may be required to address the above-mentioned difficulties.

Unlike with polysilicon, it may be difficult to control a characteristic work function of a metallic material. For this reason, when one material is employed as a gate electrode of a CMOS device, it may be difficult to control characteristics between an NMOS transistor and a PMOS transistor. As a result, two suitable metallic materials may need to be employed to the NMOS transistor and the PMOS transistor, respectively, and thus, a process for forming a CMOS device may become complex and the costs associated therewith may increase.

To overcome the above-mentioned difficulties, methods of forming a fully silicided (FUSI) gate electrode have been proposed in recent years. A FUSI gate electrode is a metal silicide having high melting point formed throughout a gate. In a FUSI gate electrode, an NMOS transistor and/or a PMOS transistor may have a dual work function due to the snowplow effect where dopants injected into polysilicon are segregated at the interface of a gate oxide during an annealing process performed to form a metal silicide. As a result, a CMOS device may be beneficial in readily controlling characteristics between an NMOS transistor and a PMOS transistor and reducing depletion occurring at a gate electrode. Moreover, a silicide is formed at not only a surface of polysilicon but also at the entirety thereof to thereby exhibit improved performance in comparison to a typical metal gate electrode.

Nickel silicide (NiSi) is attractive as a promising silicide material to overcome the difficulties arising from silicide materials such as titanium silicide ($TiSi_2$) or cobalt silicide ($CoSi_2$). Thus, NiSi is increasingly applied to fabrication of high-performance semiconductor devices. Nickel silicide (NiSi) has low resistance and can be silicided at a low temperature, and a small amount of silicon (Si) is consumed to form a silicide having a predetermined thickness. In particular, the amount of silicon in NiSi consumed is significantly smaller than that of silicon in $CoSi_2$. As a result, NiSi is considered to be a silicide material desirable for semiconductor devices having a thin junction.

In view of the foregoing, the study for a FUSI gate electrode acting as a metal gate electrode is focusing on $Ni_xSi_y$. Depending on a deposition thickness of nickel (Ni) and an annealing condition, nickel silicides ($Ni_xSi_y$) may take on various states such as $Ni_3Si$, NiSi, and $NiSi_2$. As a work function varies with the respective states, methods have been developed for forming a state control $Ni_xSi_y$ FUSI gate electrode.

The resistivity of NiSi is about 15 to about 20 micro-ohm/cm, which may be suitable for a FUSI gate electrode having low resistance. On the other hand, a work function of NiSi is about 4.6 eV which is equivalent to midgap of silicon used as a semiconductor substrate. Therefore, as a result it may be difficult to apply NiSi to a CMOS device where an NMOS transistor and a PMOS transistor should be used at the same time.

A work function of $Ni_3Si$ is about 4.8 eV, which may be applied to a PMOS transistor. A work function of $NiSi_2$ is about 4.4 eV, which may be applied to an NMOS transistor. Nonetheless, as $Ni_3Si$ or $NiSi_2$ each have a considerably high resistivity of about 30 to about 100 micro-ohm/cm, it may be difficult to fabricate a FUSI gate electrode having low resistance. As a result, the operating speed and the integration density of a semiconductor device may decrease.

SUMMARY OF THE INVENTION

Exemplary embodiments of the present invention provide a method of fabricating a semiconductor device and a semiconductor device fabricated thereby.

In accordance with an exemplary embodiment of the present invention, a method of fabricating a semiconductor device is provided. The method includes forming a preliminary gate pattern on a semiconductor substrate. The preliminary gate pattern includes a gate oxide pattern, a conductive pattern, and a sacrificial insulating pattern. The method further includes forming spacers on opposite sidewalls of the preliminary gate pattern, forming an interlayer dielectric pattern to expose the sacrificial insulating pattern, removing the sacrificial insulating pattern to form an opening to expose the conductive pattern, transforming the conductive pattern into a metal silicide layer and forming a metal barrier pattern along an inner profile of the opening and a metal conductive pattern to fill the opening including the metal barrier pattern. The metal silicide layer and the metal conductive pattern constitute a gate electrode.

In accordance with another exemplary embodiment of the present invention, a semiconductor device is provided. The semiconductor device includes a semiconductor substrate including a first region and a second region, a first gate electrode and a second gate electrode provided at the first region and a second region of the semiconductor substrate, respectively, a gate oxide layer interposed between the semiconductor substrate and the first gate electrode and between the semiconductor substrate and the second gate electrode; and spacers provided at both sidewalls of the first gate electrode and the second gate electrode. The first and second gate electrodes each include a metal silicide layer and a metal conductive layer and the first and second gate electrodes include metal silicide layers of different thicknesses.

In certain exemplary embodiments of the present invention, the first region and the second region of the semiconductor device are an NMOS region and a PMOS region, respectively.

In some exemplary embodiments of the present invention, the metal silicide layer of the semiconductor device includes at least one of $Ni_3Si$ and $NiSi_2$.

In some exemplary embodiments of the present invention, the metal silicide layer in the NMOS region of the semiconductor device contains relatively more amount of $NiSi_2$.

In certain exemplary embodiments of the present invention, the metal silicide layer in the PMOS region of the semiconductor device contains relatively more amount of $Ni_3Si$.

In certain exemplary embodiments of the present invention, a metal barrier layer is provided between the metal silicide layer and the metal conductive layer of the semiconductor device.

In some exemplary embodiments of the present invention, the metal barrier layer of the semiconductor device contains one selected from the group consisting of titanium nitride, tantalum nitride, tungsten nitride, and molybdenum nitride.

In some exemplary embodiments of the present invention, the metal conductive layer of the semiconductor device includes either one of nickel (Ni) and cobalt (Co).

BRIEF DESCRIPTION OF THE DRAWINGS

Exemplary embodiments of the present invention can be understood in more detail from the following detailed description taken in conjunction with the accompanying figures, in which like references indicate similar elements, and in which.

DETAILED DESCRIPTION OF PREFERRED EMBODIMENTS OF THE INVENTION

Figure 1:
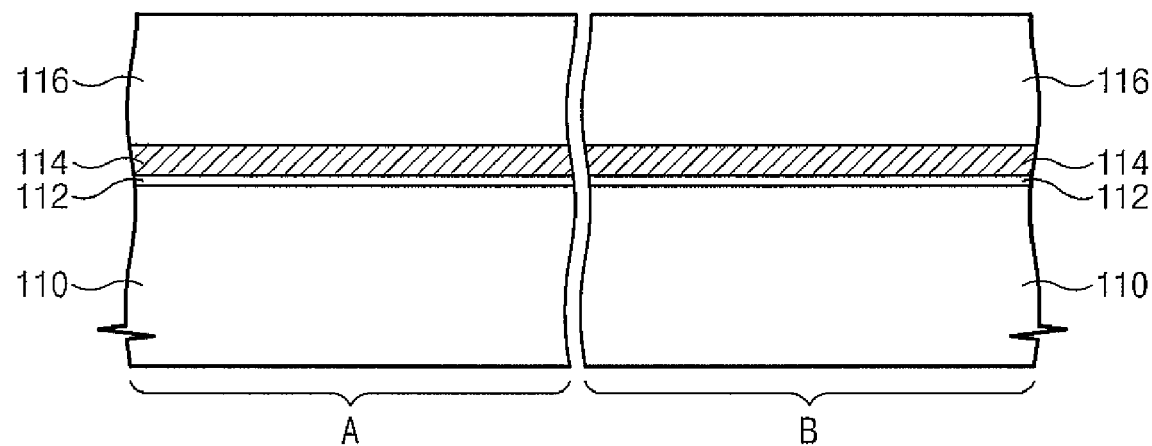
FIGS. 1 through 10 are cross-sectional views illustrating a method of fabricating a semiconductor device according to an exemplary embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2:
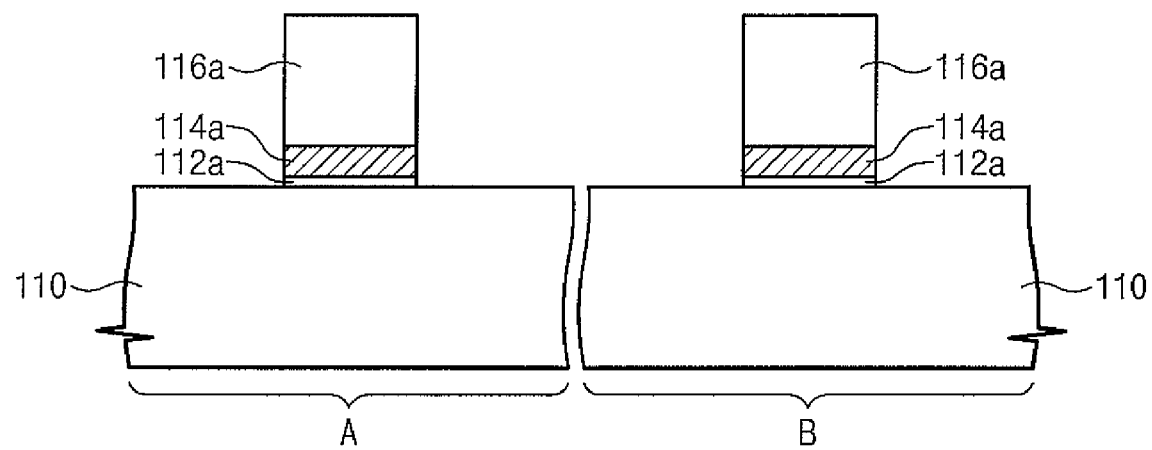

Referring to FIGS. 1 and 2, a gate oxide layer 112, a conductive layer 114, and a sacrificial insulating layer 116 are sequentially formed on a semiconductor substrate 110 including a PMOS region "A" and an NMOS region "B". The gate oxide layer 112 may be, for example, a thermal oxide layer formed by means of thermal oxidation. The conductive layer 114 may be, for example, a polysilicon layer. For example, the conductive layer 114 may be a doped polysilicon layer and formed to a thickness ranging from about 90 to about 300 angstroms. The sacrificial insulating layer 116 may be, for example, a layer of one selected from the group consisting of silicon oxide ($SiO_2$), silicon nitride (SiN), and silicon oxynitride (SiON). For example, the sacrificial insulating layer 116 may be a layer of silicon oxide.

The sacrificial layer 116, the conductive layer 114, and the gate oxide layer 112 are successively patterned to form a gate oxide pattern 112a, a conductive pattern 114a, and a sacrificial insulating pattern 116a at a predetermined area on the semiconductor substrate 110. The gate oxide pattern 112a, the conductive pattern 114a, and the sacrificial insulating pattern 116a may constitute a preliminary gate pattern. Thus, the preliminary gate pattern may be provided at the predetermined area on the semiconductor substrate 110.

Lightly doped regions may be formed in the semiconductor substrate 110 adjacent to opposite sides of the preliminary gate pattern by means of a first impurity ion implanting process using the preliminary gate pattern as an ion implanting mask.

Figure 3:
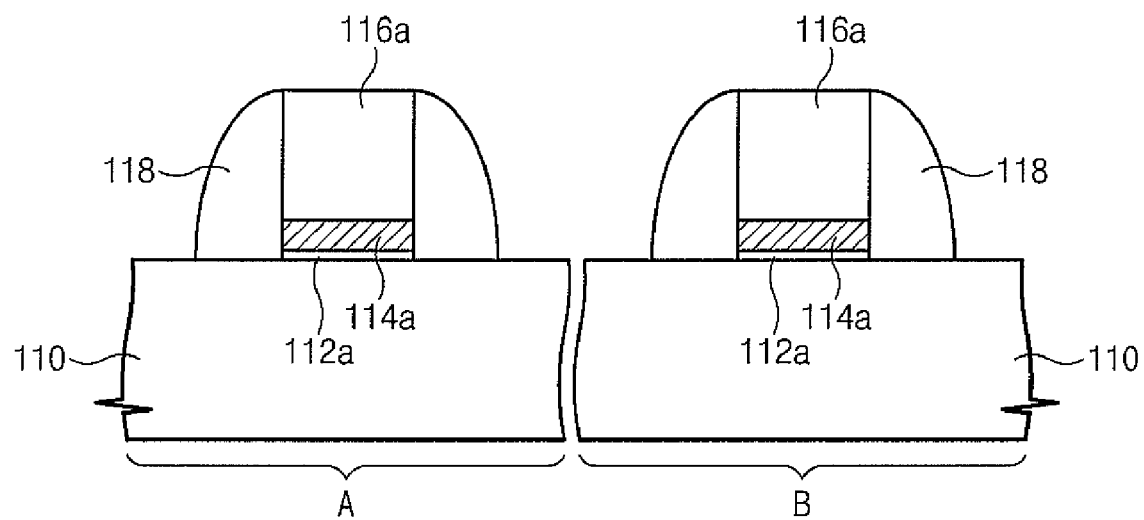

Referring to FIG. 3, spacers 118 are formed on both sidewalls of the preliminary gate pattern formed on the semiconductor substrate 110. The formation of the spacers 118 may include forming a spacer layer to cover the semiconductor substrate 110 including the preliminary gate pattern and anisotropically etching the spacer layer. The spacer layer may have an etch selectivity with respect to the sacrificial insulating pattern 116a. The spacer layer may be, for example, a layer of at least one selected from the group consisting of silicon oxide, silicon nitride, and silicon oxynitride. For example, the spacer layer may be a single layer of silicon nitride or a double layer of silicon nitride and silicon oxide because the sacrificial insulating pattern 116a may be formed of silicon oxide.

Heavily doped regions may be formed in the semiconductor substrate 110 adjacent to opposite sides of the spacer 110 by means of a second impurity ion implanting process using the spacer 110 as an ion implanting mask. The lightly doped regions and the heavily doped regions may constitute source/drain regions of a transistor.

Figure 4:
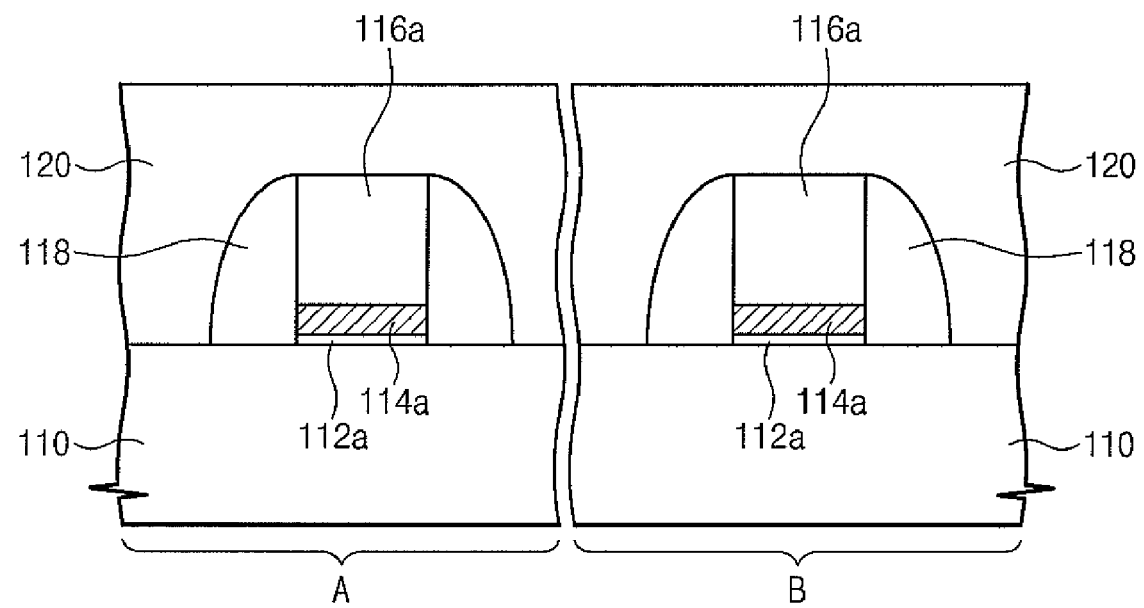
Figure 5:
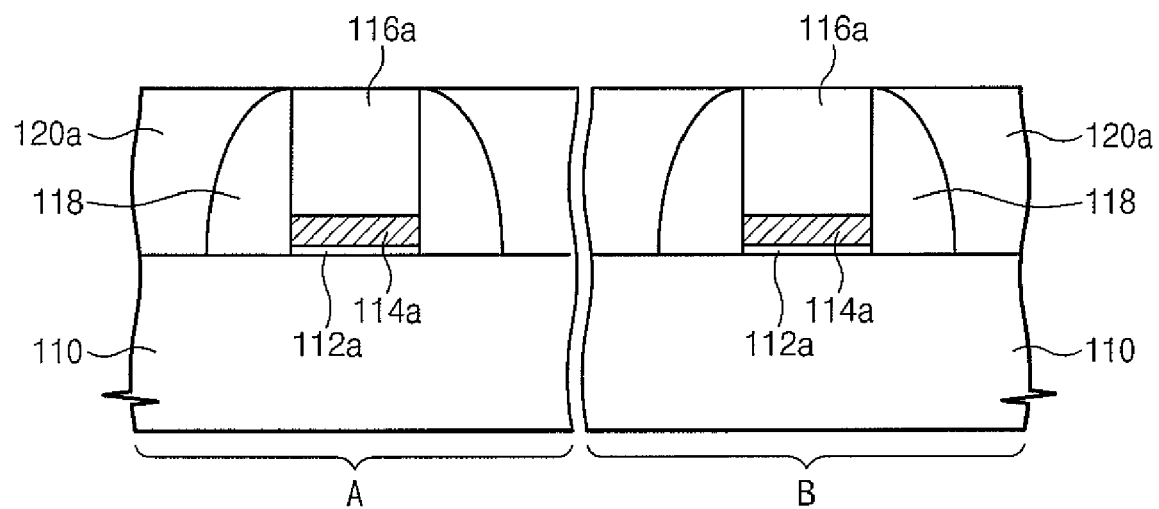

Referring to FIGS. 4 and 5, an interlayer dielectric pattern 120a is formed to expose the sacrificial insulating pattern 116a of the preliminary gate pattern. The formation of the interlayer dielectric pattern 120a may include, forming an interlayer dielectric layer 120 to cover the semiconductor substrate 110 and planarizing the interlayer dielectric layer 120 to expose the sacrificial insulating pattern 116a.

The interlayer dielectric layer 120 may have an etch selectivity with respect to the sacrificial insulating pattern 116a. The interlayer dielectric layer 120 may be, for example, a layer of one selected from the group consisting of silicon oxide, silicon nitride, and silicon oxynitride. For example, the interlayer dielectric layer 120 may be a layer of silicon nitride because the sacrificial insulating pattern 116a is formed of silicon nitride. The planarization of the interlayer dielectric layer 120 may include, for example, performing a chemical mechanical polishing (CMP) process.

Figure 6:
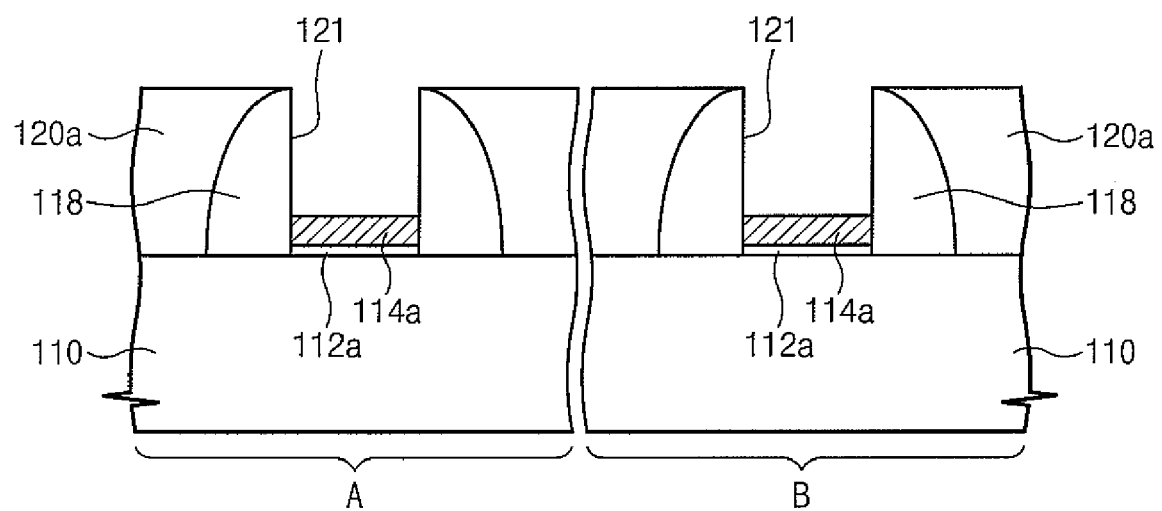

Referring to FIG. 6, the sacrificial insulating pattern 116a exposed by the interlayer dielectric pattern 120a is selectively removed. Thus, an opening 121 may be formed to expose the conductive pattern 114a. The opening 121 may have the shape surrounded by the spacer 118. The removal of the sacrificial insulating pattern 116a may include, for example, performing a wet etch process. For example, the removal of the sacrificial insulating pattern 116a may be done by means of a wet etch process using hydrofluoric acid (HF) or a mixture of HF and ammonium hydrofluoride ($NH_4F$) as an etching solution.

Figure 7:
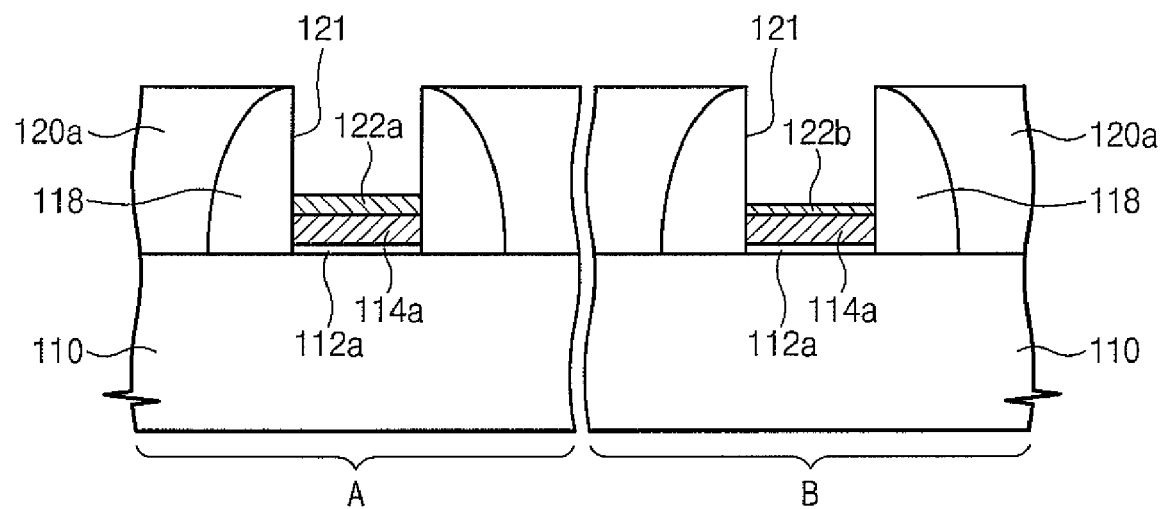
Figure 8:
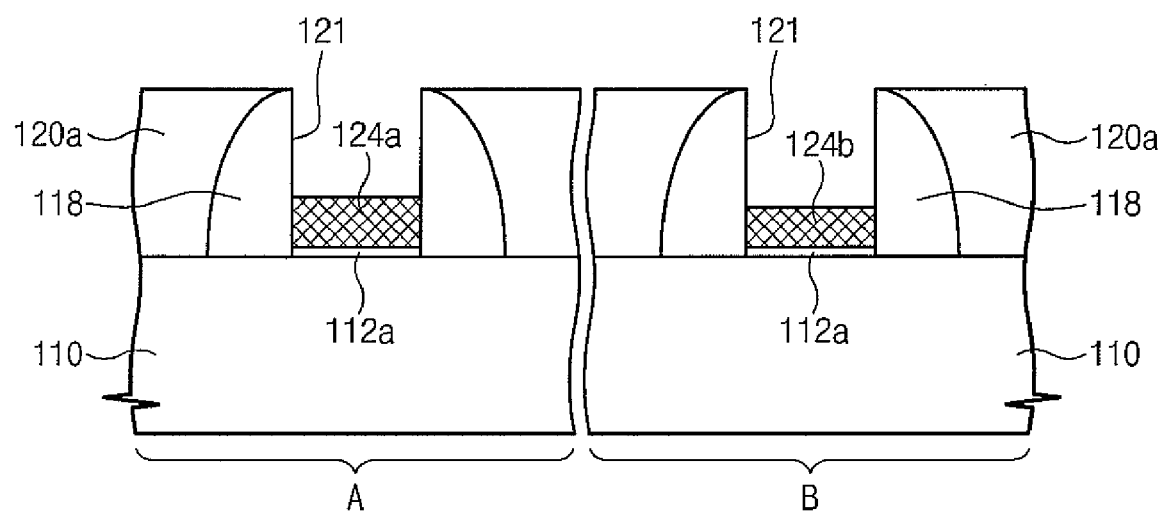

Referring to FIGS. 7 and 8, the conductive pattern 114a is transformed into metal silicide layers 124a and 124b. The transformation of the conductive pattern 114a into the metal silicide layers 124a and 124b may include forming metal layers 122a and 122b on the conductive pattern 114a and reacting the conductive pattern 114a to the metal layers 122a and 122b by means of an annealing process to be transformed into the metal silicide layers 124a and 124b.

The formation of the metal layers 122a and 122b may include, for example, performing an electroless selective deposition process. Thus, the metal layers 122a and 122b may be selectively formed on the conductive pattern 114a exposed by the opening 121. Each of the metal layers 122a and 122b may contain, for example, nickel (Ni) and formed to a thickness ranging from 10 to 300 angstroms. The metal layer 122b in the NMOS region "B" may be formed to be thinner than the metal layer 122a in the PMOS region "A", which may include covering the PMOS region "A" with a mask and etching the metal layer 122b in the NMOS region "B".

The annealing process may be, for example, a rapid thermal silicidation (RTS) process, which is performed within a process temperature ranging from about 300 to about 1,000 degrees centigrade. For example, the annealing process may be performed within a process temperature ranging from about 400 to about 600 degrees centigrade. The annealing process may be performed, for example, under an atmosphere containing argon (Ar), nitrogen ($N_2$), helium (He), and hydrogen ($H_2$) gases or under an atmosphere without these gases. Moreover, the annealing process may be performed, for example, at a process pressure range of about $1\times10^{-8}$~760 torr.

The metal silicide layers 124a and 124b may contain, for example, one or both of $Ni_3Si$ and $NiSi_2$ and be formed to a thickness ranging from about 100 to about 500 angstroms. As the metal silicide layers 124a and 124b are formed by the annealing reaction, the thicknesses of the metal silicide layers 124a and 124b may be similar to the sum of the thickness (about 90 to about 300 angstroms) of the conductive pattern 114a and the thicknesses (about 10 to about 300 angstroms) of the metal layers 122a and 122b. Moreover, the metal silicide layers 124a and 124b may have a FUSI structure by adjusting the thickness of the metal layers 122a and 122b and the conditions of the annealing process.

As the metal silicide layers 124a and 124b are formed by the reaction of the conductive pattern 114a and the metal layers 122a and 122b, the metal silicide layers 124a and 124b may exhibit various shapes according to the deposition thickness of the metal layers 122a and 122b. If the deposition thickness of the metal layers 122a and 122b is large, the metal silicide layers 124a and 124b may mainly contain $Ni_3Si$. If the deposition thickness of the metal layers 122a and 122b is small, the metal silicide layers 124a and 124b may mainly contain $NiSi_2$. Thus, a gate electrode of an NMOS transistor or a PMOS transistor may be formed by controlling the deposition thickness of the metal layers 122a and 122b for forming the metal silicide layers 124a and 124b. If the metal layer 122b in the NMOS region "B" is formed to have a smaller thickness than the metal layer 122a in the PMOS region "A", the metal silicide layer 124a in the PMOS region "A" and the metal silicide layer 124b in the NMOS region "B" may mainly contain $Ni_3Si$ and $NiSi_2$, respectively. Thus, the metal silicide layer 124a in the PMOS region "A" and the metal silicide layer 124b in the NMOS region "B" may be used as a gate electrode in a PMOS transistor or an NMOS transistor.

In the case of the semiconductor substrate 110 including a single region, if the annealing process temperature is approximately 400 degrees centigrade, the metal silicide layers 124a and 124b may mainly contain $Ni_3Si$. If the annealing process temperature is approximately 600 degrees centigrade, the metal silicide layers 124a and 124b may mainly contain $NiSi_2$. Thus, the gate electrode of the NMOS transistor or the PMOS transistor may be formed by controlling the temperature of the annealing process for forming the metal silicide layers 124a and 124b.

The metal silicide layers 124a and 124b are formed of $Ni_xSi_y$, to a minimum thickness to act as the gate electrode, assuring stability of a process for forming a FUSI gate electrode and broadening conditions of the process. The deposition thickness of the metal layers 122a and 122b and the annealing process are regulated by means of the electroless selective deposition process so that unreactive metal layers 122a and 122b do not remain. Thus, a PAN strip process using a mixture of phosphoric acid, acetic acid, and nitric acid to strip the unreactive metal layers 122a and 122b may be omitted to simplify the steps of forming a semiconductor device.

Figure 9:
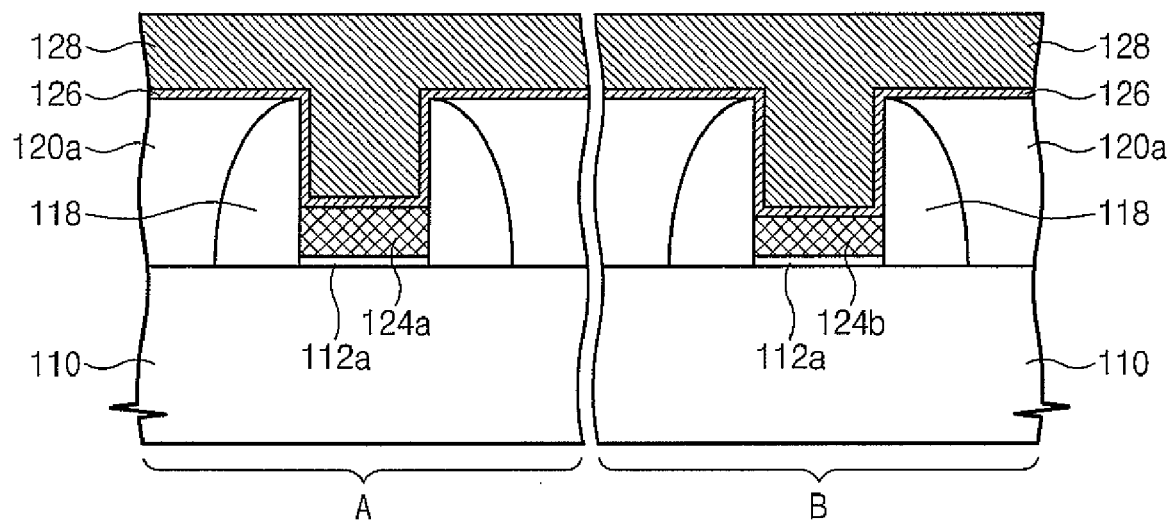
Figure 10:
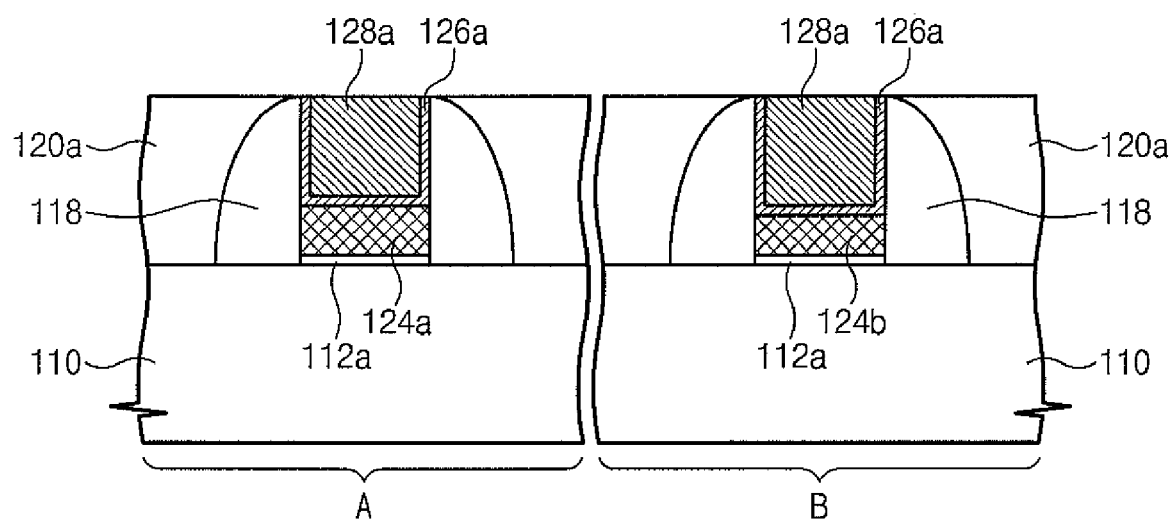

Referring to FIGS. 9 and 10, after transforming the conductive pattern 114a into the metal silicide layers 124a and 124b, a metal barrier pattern 126a is formed along the inner profile of the opening 121 and a metal conductive pattern 128a is formed to fill the opening 121 including the metal barrier pattern 126a.

The formation of the metal barrier pattern 126a and the metal conductive pattern 128a may include forming a metal barrier layer 126 along the profile of the interlayer dielectric pattern 120a including the opening 121, forming a metal conductive layer 128 to cover the semiconductor substrate 110 including the metal barrier layer 126, and planarizing the metal conductive layer 128 and the metal barrier layer 126 to expose the interlayer dielectric pattern 120a.

The formation of the metal barrier layer 126 may include, for example, performing a chemical vapor deposition (CVD) process. The metal barrier layer 126 may contain, for example, one selected from the group consisting of titanium nitride (TiN), tantalum nitride (TaN), tungsten nitride (WN), and molybdenum nitride (MoN). The formation of the metal conductive layer 128 may include, for example, performing a CVD process or an electroless plating process. The metal conductive layer 128 may contain, for example, either one of nickel (Ni) and cobalt (Co).

Nickel and cobalt contained in the metal conductive layer 128 have resistivity ranges of about 14 to about 16 micro-ohms/cm and about 15 to about 18 micro-ohms/cm, respectively. The metal conductive layer 128 may be deposited, for example, by means of a CVD process or an electroless plating process exhibiting beneficial step coverage. Thus, a semiconductor device including a gate electrode of low surface resistance may be provided.

As the above-described semiconductor device of exemplary embodiments of the present invention includes a gate electrode comprising a FUSI metal silicide layer and a metal conductive pattern of low surface resistance, unlike with the conventional art, a gate electrode of low surface resistance may be provided. Moreover, exemplary embodiments of the present invention may provide a semiconductor device with improved operating speed and a method of fabricating the same. In addition, exemplary embodiments of the present invention may provide a semiconductor device with increased integration density and a method of fabricating the same.

Having described the exemplary embodiments of the present invention, it is readily apparent to those of reasonable skill in the art that various modifications may be made without departing from the sprit and scope of the invention which is defined by the metes and bounds of the appended claims.

What is claimed is:

1. A method of fabricating a semiconductor device, comprising:
    forming a preliminary gate pattern on a semiconductor substrate, the preliminary gate pattern including a gate oxide pattern, a conductive pattern, and a sacrificial insulating pattern;

forming spacers on opposite sidewalls of the preliminary gate pattern;

forming an interlayer dielectric pattern to expose the sacrificial insulating pattern;

removing the sacrificial insulating pattern to form an opening to expose the conductive pattern;

transforming the conductive pattern into a metal silicide layer; and forming a metal barrier pattern along an inner profile of the opening and a metal conductive pattern to fill the opening including the metal baffler pattern, wherein the metal silicide layer and the metal conductive pattern constitute a gate electrode.

2. The method as set forth in claim 1, wherein the spacer has an etch selectivity with respect to the sacrificial insulating pattern.

3. The method as set forth in claim 1, wherein the metal silicide layer comprises at least one of $Ni_3Si$ and $NiSi_2$.

4. The method as set forth in claim 3, wherein the metal silicide layer is formed to have a thickness ranging from about 100 to about 500 angstroms.

5. The method as set forth in claim 1, wherein the transforming the conductive pattern into the metal silicide layer comprises:

forming a metal layer on the conductive pattern; and performing an annealing process to transform the conductive pattern and the metal layer into the metal silicide layer.

6. The method as set forth in claim 5, wherein the annealing process is performed at a process temperature ranging from about 300 to about 1,000 degrees centigrade.

7. The method as set forth in claim 5, wherein the forming of the metal layer comprises performing an electroless selective deposition process.

8. The method as set forth in claim 7, wherein the metal layer includes nickel (Ni).

9. The method as set forth in claim 8, wherein the metal layer is formed to have a thickness ranging from about 10 to about 300 angstroms.

10. The method as set forth in claim 1, wherein the conductive pattern includes polysilicon.

11. The method as set forth in claim 10, wherein the conductive layer is formed to have thickness ranging from about 90 to about 300 angstroms.

12. The method as set forth in claim 1, wherein the forming of the metal barrier pattern and the metal conductive pattern comprises:

forming a metal barrier layer along a profile of the interlayer dielectric pattern including the opening;

forming a metal conductive layer to cover the semiconductor substrate including the metal baffler layer; and planarizing the metal conductive layer and the metal barrier layer to expose the interlayer dielectric pattern.

13. The method as set forth in claim 12, wherein the forming of the metal conductive layer comprises performing one of a chemical vapor deposition (CVD) process or an electroless plating process.

14. The method as set forth in claim 13, wherein the metal conductive layer includes either one of nickel (Ni) and cobalt (Co).

15. A semiconductor device comprising:

a semiconductor substrate including a first region and a second region;

a first gate electrode and a second gate electrode provided at the first region and a second region of the semiconductor substrate, respectively, the first and second gate electrodes each including a metal silicide layer and a metal conductive layer;

a gate oxide layer interposed between the semiconductor substrate and the first gate electrode and between the semiconductor substrate and the second gate electrode;

spacers provided at both sidewalls of the first gate electrode and the second gate electrode; and a metal barrier layer interposed between the metal silicide layer and the metal conductive layer and between the metal conductive layer and the spacers, wherein the first and second gate electrodes include metal suicide layers of different thicknesses.

16. The semiconductor device as set forth in claim 15, wherein the first region and the second region are an NMOS region and a PMOS region, respectively.

17. The semiconductor device as set forth in claim 15, wherein the metal conductive layer includes either one of nickel (Ni) and cobalt (Co).

18. The semiconductor device as set forth in claim 15, wherein the metal silicide layer includes at least one of $Ni_3Si$ and $NiSi_2$.

19. The semiconductor device as set forth in claim 18, wherein the metal silicide layer in the NMOS region contains relatively more amount of $NiSi_2$.

20. The semiconductor device as set forth in claim 18, wherein the metal silicide layer in the PMOS region contains relatively more amount of $Ni_3Si$.

* * * * *